United States Patent
Schumann

(10) Patent No.: US 6,210,056 B1
(45) Date of Patent: Apr. 3, 2001

(54) CIRCUIT ARRANGEMENT FOR LEVEL CONVERSION OF BINARY SIGNALS IN A CONTROL SYSTEM FOR A PRINTING-TECHNOLOGY MACHINE

(75) Inventor: Frank Schumann, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 09/212,644

(22) Filed: Dec. 15, 1998

(30) Foreign Application Priority Data

Dec. 15, 1997 (DE) .............................. 197 55 585

(51) Int. Cl.[7] .................................. B41J 29/00
(52) U.S. Cl. .............................. 400/719; 347/19
(58) Field of Search ................ 400/719; 347/5, 347/19; 395/109

(56) References Cited

U.S. PATENT DOCUMENTS

| | | | |
|---|---|---|---|
| 4,083,042 | * 4/1978 | Kushin et al. | 345/39 |
| 4,847,865 | * 7/1989 | Larson | 375/319 |
| 4,865,075 | * 9/1989 | Smith | 382/270 |
| 5,041,795 | * 8/1991 | Bowers | 330/69 |
| 5,359,238 | * 10/1994 | Lesko | 307/358 |
| 5,533,054 | * 7/1996 | DeAndrea et al. | 375/286 |
| 5,757,394 | * 5/1998 | Gibson et al. | 347/17 |

* cited by examiner

Primary Examiner—John S. Hilten
Assistant Examiner—Minh H. Chau
(74) Attorney, Agent, or Firm—Herbert L. Lerner; Laurence A. Greenberg; Werner H. Stemer

(57) ABSTRACT

A circuit arrangement for the level conversion of binary signals in a control system of a printing-technology machine, includes a component for transmitting a signal and a component for receiving the signal, the signal-transmitting component having an element for generating a binary level value, and a window discriminator provided between the signal-transmitting component and the signal-receiving component, the window discriminator having a lower threshold value and an upper threshold value corresponding to binary level values, the window discriminator further having a signal input and a signal output, the signal input being connected to an output of the signal-transmitting component, the signal output of the window discriminator being connected to an input of the signal-receiving component, the signal input being at a level lying between the lower and the upper threshold values when the element of the signal-transmitting component, for generating a binary level value, is not driven.

3 Claims, 1 Drawing Sheet

CIRCUIT ARRANGEMENT FOR LEVEL CONVERSION OF BINARY SIGNALS IN A CONTROL SYSTEM FOR A PRINTING-TECHNOLOGY MACHINE

BACKGROUND OF THE INVENTION

Field of the Invention

The invention relates to a circuit arrangement for level conversion of binary signals in a control system for a printing-technology machine, in particular, a printing press. In order to control operating procedures of a machine in the field of printing technology, a multiplicity of actuators and sensors are provided which interact with one or more control circuits. If binary signals are transmitted line-bound between the actuators or sensors and a control circuit, then the binary signals are expressed by DC voltage values which are generated by electronic components of a driver circuit. On account of the unavoidable component tolerances and a desired interference immunity, a low level or L level and a high level or H level are defined as the binary signal values (0; 1), the H level lying in a range above an upper threshold value and the L level lying in a range below a lower threshold value. The range between upper and lower threshold values corresponds to no binary signal value (0; 1). Driver circuits and receiver circuits operate either according to the principle of so-called positive logic, in which case the binary signal value (1) is defined by the H level, or according to the principle of negative logic, in which case the binary signal value (1) is defined by the L level. In order to ensure the interaction of the actuators or sensors with the control circuit, the binary signal values (0; 1) must correspond to the desired levels. In order to increase the flexibility in the controllers and the connected actuators or sensors, it has been known heretofore to provide additionally inverted inputs and outputs, respectively, for inputs and outputs, with the result that it is optionally possible to operate in positive or negative logic. Faulty circuits cannot be precluded in this case, in particular when an element is to be renewed on the control circuit side or on the actuator/sensor side. In order to reduce the probability of faulty circuits, it is possible to resort to compatible elements of one and the same property, which have to be available in stock and should, as much as possible, originate from the same manufacturer. At the output, driver circuits have an electrical switching element which, when it is driven, generates an H or L level at the output. In this regard, embodiments are possible wherein the switching element establishes a low-impedance connection to a positive operating voltage source or to the zero potential of the operating voltage source. In further different embodiments, the switching elements are connected to resistors. In the case of push-pull output stages, two electrical switching elements act at the output, the switching elements being able to connect the output in a low-impedance manner both with respect to the positive operating voltage source and with respect to the zero potential or a negative operating voltage source. In addition to the switching elements described hereinbefore, which, at the output, set DC voltage values corresponding to the binary signal values (0; 1), driver circuits are known which have switchable current sources in addition to the output stage.

SUMMARY OF THE INVENTION

It is accordingly an object of the invention to provide a circuit arrangement for level conversion of binary signals for a control system for printing-technology machines wherein the compatibility of a control circuit thereof and of actuators or sensors of the machine connected thereto is improved.

With the foregoing and other objects in view, there is provided, in accordance with the invention, a circuit arrangement for the level conversion of binary signals in a control system of a printing-technology machine, comprising a component for transmitting a signal and a component for receiving the signal, the signal-transmitting component having an element for generating a binary level value, and a window discriminator provided between the signal-transmitting component and the signal-receiving component, the window discriminator having a lower threshold value and an upper threshold value corresponding to binary level values, the window discriminator further having a signal input and a signal output, the signal input being connected to an output of the signal-transmitting component, the signal output of the window discriminator being connected to an input of the signal-receiving component, the signal input being at a level lying between the lower and the upper threshold values when the element of the signal-transmitting component, for generating a binary level value, is not driven.

In accordance with another feature of the invention, the binary level lying between the threshold values corresponds to an average value of the upper and the lower threshold values.

In accordance with a further feature of the invention, the signal input is additionally connected to a tap of a voltage divider, the voltage divider being connected to voltage sources having levels which are below the lower threshold value and above the upper threshold value.

In accordance with a concomitant feature of the invention, the voltage divider is formed of two series-connected resistors.

Irrespective of whether the driver output stage of a component transmitting a binary signal is formed as a voltage source or as a voltage source with an additional current source, or operates according to the principle of positive or negative logic, a binary signal 0 or 1 is always generated when an activated driver output stage is at the output of the circuit arrangement, the binary signal serving to characterize the state of activation of the driver output stage in accordance with the agreed definition.

It is expedient to integrate the circuit arrangement in the actuators or sensors. The actuators and sensors, respectively, are thereby enabled to operate on any desired controls. The level conversion proceeds virtually with no time delay. The components which are used are commercially available, reliable and cost-effective. The configuration of the signal-outputting components of a control system of a printing-technology machine is simplified because, in order to generate a binary control signal 0 or 1, the outputting components merely have to be brought into an activated state.

Other features which are considered as characteristic for the invention are set forth in the appended claims.

Although the invention is illustrated and described herein as embodied in a circuit arrangement for level conversion of binary signals in a control system of a printing-technology machine, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 1:
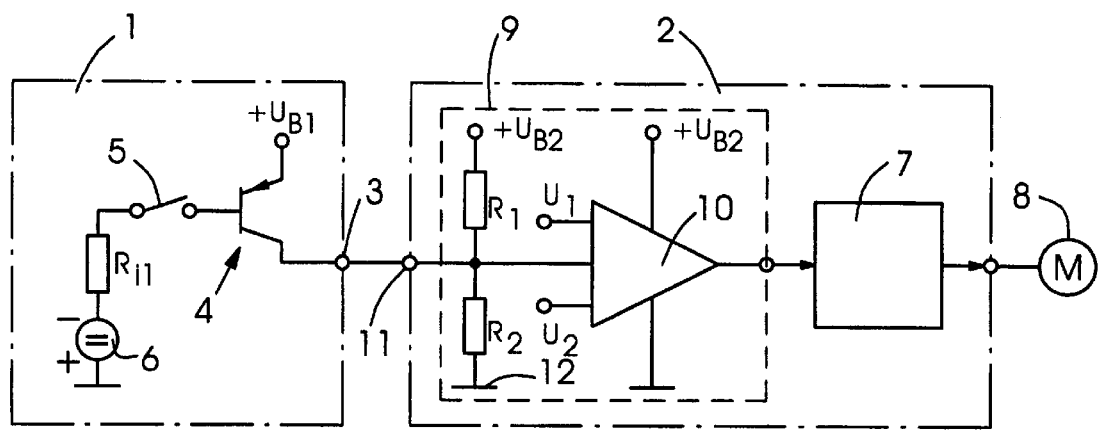
FIGS. 1, 2 and 3 are circuit diagrams of components of a printing-technology machine wherein different embodiments, respectively, of a control circuit are connected to actuators or sensors of various constructions.

Referring now to the drawings and, first, particularly to FIG. 1 thereof, there is shown therein, for the purpose of controlling a printing-technology machine, at least one control circuit 1 is provided, which is connected to at least one actuator 2. The control circuit 1 has at least one signal output 3, a binary signal being generated by a driver circuit 4 having a switching transistor a the output thereof, the emitter of the switching transistor being connected to a positive operating voltage +$U_{B1}$, the collector of the transistor to the signal output 3, and the base of the transistor to a first pole of an electronic switch 5. The second pole of the switch 5 is connected to a voltage source 6 having an internal resistance $R_{i1}$. Such a driver circuit 4 is also known as a so-called high-side switch because, when it is activated, the signal output 3 is switched in a low-impedance manner with respect to the operating voltage +$U_{B1}$.

The actuator 2 includes an electronic controlling element 7 for a motor 8 of the printing-technology machine. The controlling element 7 converts a binary input variable into an analog output variable, for example, to set the rotational speed of the motor 8. A circuit arrangement 9 for level conversion is provided as the input element of the actuator 2. The circuit arrangement 9 for level conversion includes a window discriminator 10 supplied by an operating voltage source +$U_{B2}$. The window discriminator 10 has two threshold value inputs, to which the DC voltage values $U_1$ and $U_2$, which represent an upper and a lower threshold value, respectively, are applied. The window discriminator 10, furthermore, has a signal input 11, which is connected to the tap of a voltage divider formed by series-connected resistors $R_1$ and $R_2$. The respective second terminals of the resistors $R_1$ and $R_2$ are connected to the positive operating voltage source +$U_{B2}$ and with respect to ground potential 12. If, proceeding from the control circuit 1, a binary control signal is intended to be passed to the controlling element 7, the control circuit 1 must then generate a signal that closes the switch 5. When the switch 5 closes, the driver circuit 4 of the control circuit 1 is activated, i.e., a current is driven from the voltage source 6 via the internal resistance Ril into the base of the switching transistor 4, which switches the emitter-connector path so that it has a low impedance. In the activated state, the signal output 3 is at an H potential, which is higher than the threshold value $U_1$.

Figure 2:
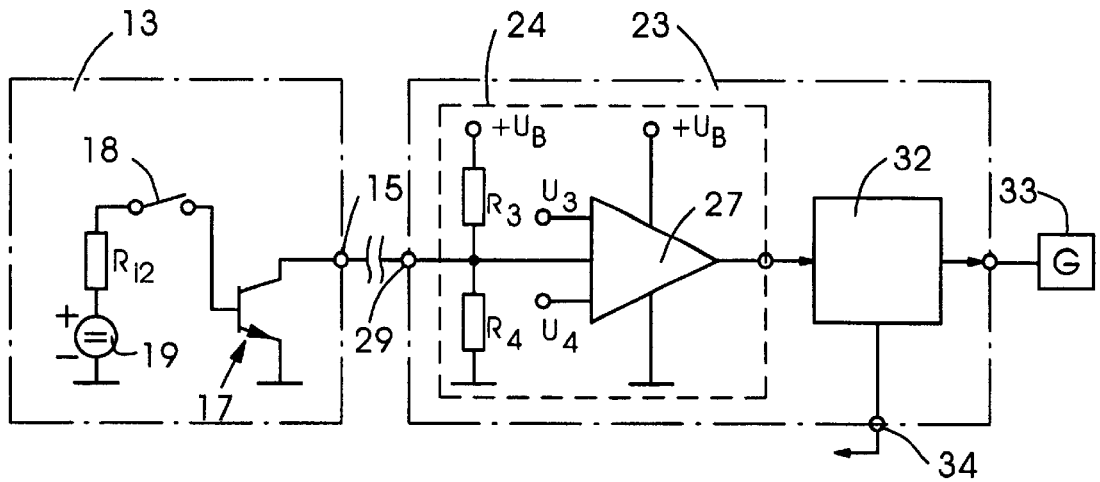
Figure 3:
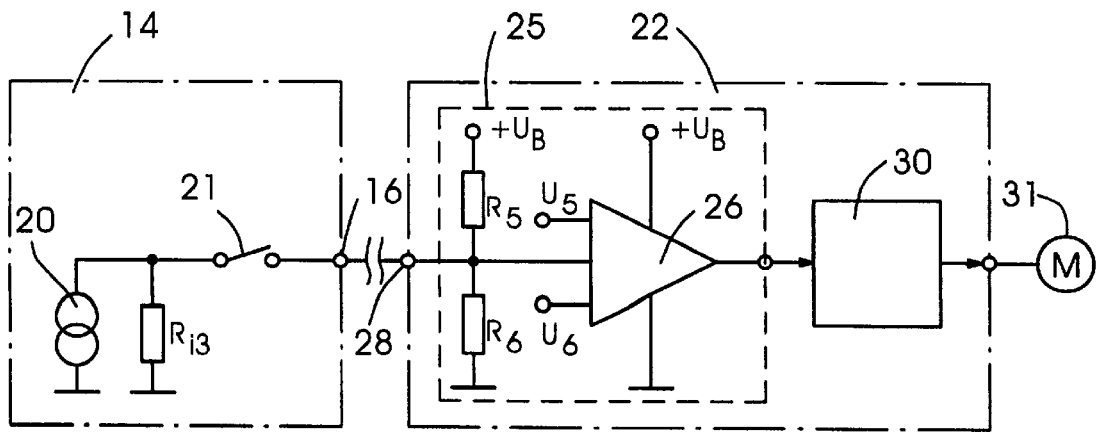

The resistors $R_1$ and $R_2$ are dimensioned so that, in the nonactivated state of the switching transistor 4, a level lying between the threshold values $U_1$ and $U_2$ is established at the signal input 11. In the activated state of the switching transistor 4, a voltage drop is produced across the resistor $R_2$ which is large enough that the signal input 11 is reliably above the upper threshold value $U_1$. In this case, the window discriminator 10 switches over, so that an H level at the signal output 3 also appears at the output of the window discriminator 10. In the nonactivated state of the switching transistor 4, the level at the signal input lies in the window region between the threshold values $U_1$ and $U_2$, so that the window discriminator 10 is not activated. An L level appears at the output of the window discriminator 10. The control circuit 1 can be operated in parallel with or as an alternative to further control circuits 13 and 14, shown in FIGS. 2 and 3, respectively. The driver circuits at the signal outputs 15 and 16 of the respective control circuits 13 and 14 differ from the driver circuit 4 of the control circuit 1. In the control circuit 13 of FIG. 2, the driver circuit is a so-called low-side switch having a switching transistor 17, the emitter of which is connected with respect to ground potential 12, the collector of which to the signal output 15, and the base of which to a first pole of a switch 18, the second pole of which is connected to a voltage source 19 having an internal resistance $R_{i2}$. In the control circuit 14 of FIG. 3, the driver circuit is a switchable current source 20 having an internal resistance $R_{i3}$. An electronic switch 21 is connected between the voltage source 20 and the signal output 16. As previously described herein with regard to the control circuit 1, the driver circuits of FIGS. 2 and 3 can be shifted into an activated state by closing the switches respective 18 and 21. If, as required, the actuator 2 is connected to the control circuit 13, the signal output 15 is then brought to L potential when the switch 18 is closed. A current flow is produced through the resistor $R_1$ and the switching transistor 17, the voltage drop produced across the resistor $R_1$ bringing the level at the signal input 11 to a value which is below the lower threshold value $U_2$. Consequently, an H level is present at the output of the window discriminator 10. As described with regard to the control circuit 1, activation of the driver circuit 4 generates an H potential at the output of the window discriminator 10.

If an actuator 2 is connected to the control circuit 14 having a current source output 16, the function by which an activated driver circuit generates an H potential at the output of the window discriminator 10 is then preserved. When the switch 21 is closed, the current driven by the current source 20 is divided at the tapping point of the voltage divider in accordance with the divider ratio of the resistors R1 and R2. A voltage level lying outside the window region between $U_1$ and $U_2$ is established at the signal input 11, due to which the output of the window discriminator is switched to H level.

Actuators or sensors 2, 22 or 23, as the case may be, of different construction can readily be connected to the respective control circuits 1, 13 and 14 as long as the circuit arrangement 9 described hereinbefore with regard to the actuator 2 is provided. As can be inferred from the figures, the actuator 22 and the sensor 23 contain circuit arrangements 24 and 25, respectively, for level conversion, each of which include a window discriminator 27 and 26, respectively, and respective voltage dividers formed by resistors $R_3$ and $R_4$, on the one hand, and $R_5$ $_{and}$ $R_6$, on the other hand, at signal inputs 29 and 28, respectively. The window threshold values are defined by DC voltage values $U_3$ and $U_4$, on the one hand, and $U_5$ and U6, on the other hand. The function of the circuit arrangements 24 and 25 corresponds to the function of the circuit arrangement 9. The controlling elements 7 and 30, respectively, of the actuators 2 and 22 for the motors 8 and 31, respectively, can be constructed in a wide variety of different ways, it merely being necessary to ensure that the controlling elements 7 and 30 can be driven by the binary levels output by the respective window discriminators 10 and 26. The sensor 23 has a circuit arrangement 32, the measured-value acquisition function of which is controlled by binary signals. For example, it is possible to control the provision of measured values regarding the dimensions or the position of an object 33 at a signal output 31 of the sensor 23 by the logic H/L levels.

With the aid of the circuit arrangement 9, 24, 25, it is possible to operate structurally identical sensors 23, actuators 2, 22 and other binary-controllable components on different controllers, thereby improving the flexibility in the design, the production and in the service of the control system for the printing-technology machine.

I claim:

1. A circuit arrangement for the level conversion of binary signals in a control system of a printing-technology machine, comprising a component for transmitting a signal and a component for receiving the signal, said signal-transmitting component having an element for generating a binary level value and said signal-receiving component having an element for receiving a binary level value; and a window discriminator provided between said signal-transmitting component and said signal-receiving component, said window discriminator having a lower threshold value and an upper threshold value corresponding to binary level values, said window discriminator further having a binary signal input and a binary signal output, said signal input being connected to an output of said signal-transmitting component, said signal output of said window discriminator being connected to an input of said signal-receiving component, said signal input being at a level lying between said lower and said upper threshold values when said element of said signal-transmitting component, for generating a binary level value, is not driven.

2. The circuit arrangement according to claim 1, wherein said element for generating the binary level value adjusts the binary level between said threshold values corresponding to an average value of said upper and said lower threshold values.

3. The circuit arrangement according to claim 1, wherein said signal input is additionally connected to a tap of a voltage divider, said voltage divider being connected to voltage sources having levels which are below said lower threshold value and above said upper threshold value.

* * * * *